United States Patent
Wagers et al.

[11] Patent Number: 6,022,790
[45] Date of Patent: Feb. 8, 2000

[54] SEMICONDUCTOR PROCESS INTEGRATION OF A GUARD RING STRUCTURE

[75] Inventors: Kenneth Wagers, Los Angeles; Ming Zhou, Long Beach, both of Calif.

[73] Assignee: International Rectifier Corporation, El Segundo, Calif.

[21] Appl. No.: 09/129,651

[22] Filed: Aug. 5, 1998

[51] Int. Cl.[7] .................................................. H01L 21/76
[52] U.S. Cl. .......................... 438/454; 438/270; 438/294; 438/279
[58] Field of Search .................................... 438/133, 140, 438/49, 294, 454, 270, 279; 257/127, 170, 409, 605

[56] References Cited

U.S. PATENT DOCUMENTS

| | | | |
|---|---|---|---|
| 5,216,275 | 6/1993 | Chen ........................................ | 257/493 |
| 5,744,843 | 4/1998 | Efland et al. ............................ | 257/369 |
| 5,795,793 | 8/1998 | Kinzer ..................................... | 438/307 |
| 5,880,501 | 3/1999 | Nagai ...................................... | 257/355 |
| 5,940,721 | 8/1999 | Kinzer et al. ............................ | 438/454 |

FOREIGN PATENT DOCUMENTS

| | | |
|---|---|---|
| 0557253 | 8/1993 | European Pat. Off. . |
| 0635888 | 1/1995 | European Pat. Off. . |
| 0665595 | 8/1995 | European Pat. Off. . |
| 0671769 | 9/1995 | European Pat. Off. . |
| 2087648 | 5/1982 | United Kingdom . |
| 2127222 | 4/1984 | United Kingdom . |

*Primary Examiner*—Chandra Chaudhari
*Assistant Examiner*—Evan Pert
*Attorney, Agent, or Firm*—Ostrolenk, Faber, Gerb & Soffen, LLP

[57] ABSTRACT

A method is presented for forming a guard ring of a semiconductor device in the termination area in tandem with forming the active area structure of the device. The guard ring is formed using the same processing steps that form the active region structure, at the same time, without requiring additional masking steps or a passivation layer. The guard ring is formed in an opening in the field oxide located in the termination area and is electrically connected to a polysilicon field plate that is located atop a portion of the field oxide region. The guard ring increases the rated voltage of the device without the introduction of a passivation layer.

12 Claims, 4 Drawing Sheets

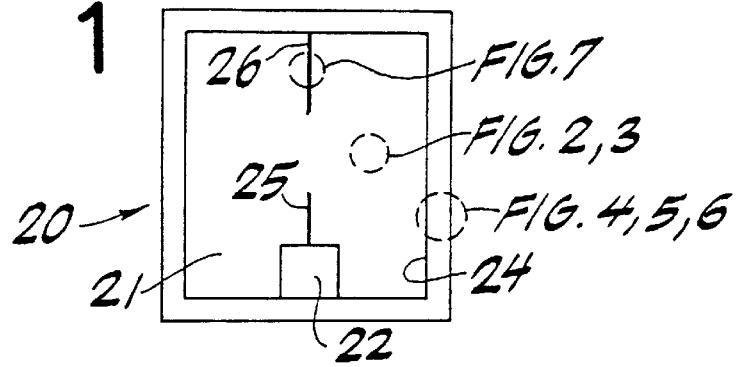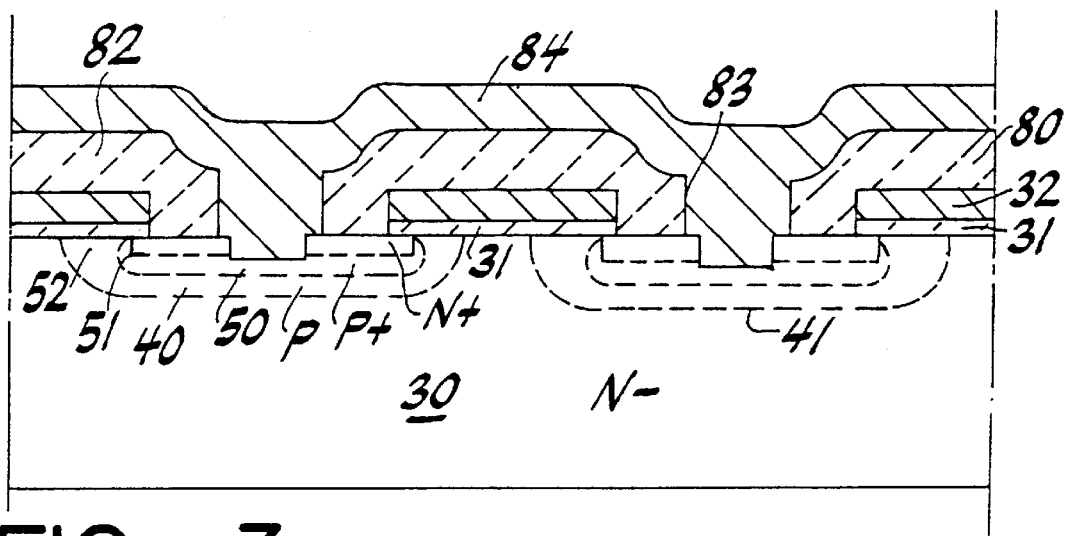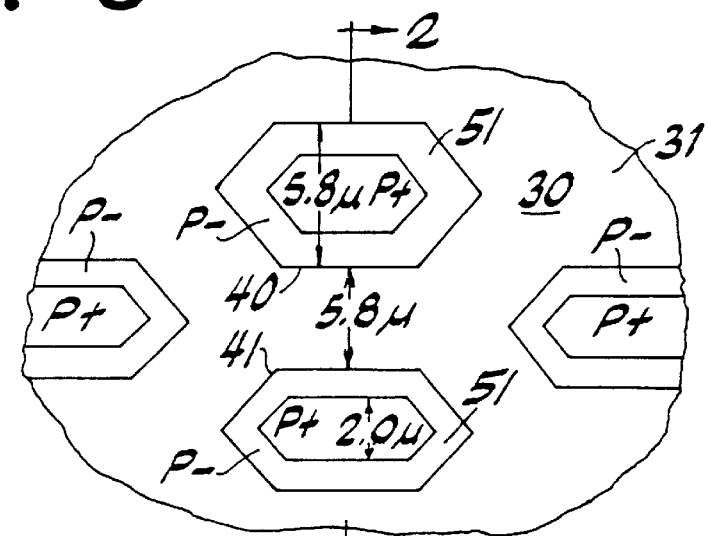

SEMICONDUCTOR PROCESS INTEGRATION OF A GUARD RING STRUCTURE

BACKGROUND OF THE INVENTION

The present invention relates to semiconductor devices and, more specifically, to a guard ring termination structure for semiconductor devices, such as MOS gate controlled ("MOS-gated") semiconductor devices, that can be manufactured without added masking steps.

MOS-gated devices are well known in the art and include devices such as the MOS-gated devices shown in U.S. Pat. No. 5,795,793 the subject matter of which is incorporated herein by reference. MOS-gated devices also include power MOSFETs, MOS-gated thyristors, gate turn-off devices and the like.

The MOS-gated devices are typically formed of a plurality of active cells which include cells located at the periphery of the die. The peripheral cells, when subject to the full source-to-drain voltage, are prone to avalanche breakdown between the outermost portion of the cell and the adjacent street.

It is therefore desirable to provide a device structure that prevents breakdown at the active peripheries of the chip.

The manufacturing process for devices that include such structures typically includes a number of photolithographic masking steps and critical mask alignment steps each of which adds manufacturing time and expense as well as provides possible sources of device defects.

It is therefore also desirable to employ a termination structure that occupies a minimum surface area of the chip and does not require added masking steps.

The manufacturing process for such devices also typically includes the fabrication of a passivation structure to permit operation at higher voltages. The addition of the passivation layer also requires added photolithographic masking and mask alignment steps each of that further add manufacturing time and expense as well as provide additional sources of device defects.

It is therefore further desirable to employ a termination structure that permits operation at higher voltages without requiring passivation.

SUMMARY OF THE INVENTION

The present invention provides for a guard ring structure at the active peripheries of a semiconductor device to prevent breakdown at the peripheries of the device.

An aspect of the invention relates to a termination structure of a semiconductor device which includes a guard ring and to a process for fabricating the termination structure. A layer of field insulation material is formed atop a silicon substrate, and selected portions are patterned and etched away to form at least one opening therein which defines an active area and at least another opening which is substantially ring-shaped and surrounds the active area. A layer of polysilicon is deposited, and selected portions are patterned and etched away to form at least one opening that exposes the ring-shaped opening in the layer of field insulation material and so that a remaining portion of the layer of polysilicon that is atop the layer of field insulation material defines a polysilicon field plate. Impurities of a first conductivity type are introduced into surface regions of the silicon substrate that are located beneath the ring-shaped opening in the layer of field insulation material to form first diffused regions, and impurities of a second conductivity type are introduced into the surface regions to form second diffused regions. The first diffused regions are deeper and wider than the second diffused regions. An overlaying insulation layer is deposited, and selected portions of the layer are patterned and etched away to form first openings therein which expose portions of the polysilicon field plate and second openings which expose portions of the surface regions. An overlaying conductive layer is deposited and portions thereof are patterned and etched away to form at least one electrode which connects the polysilicon field plate with the surface regions.

In accordance with this aspect of the invention, depressions are etched in the portions of the surface region of the silicon substrate to a depth that is greater than that of the second diffused regions, and sidewalls of the overlaying insulation layer may be etched to expose further portions of the surface regions which are each adjacent to and surround a depression. The electrode thus connects the polysilicon field plate with the depressions and the further portions of the surface regions.

Impurities of the first conductivity type may be introduced into the surface regions to form third diffused regions. The second diffused regions thus have a final depth that is less than that of the third diffused regions, and the first diffused regions are deeper and wider than and have a lower concentration than that of the third diffused regions. The electrode connects the polysilicon field plate with the second and third diffused regions.

Another aspect of the invention is directed to a semiconductor device having a termination structure which includes a guard ring and to a process for fabricating the semiconductor device. A layer of field insulation material is formed atop a silicon substrate, and portions of the layer are patterned and etched away to form at least one opening therein which defines an active area and at least another opening which is substantially ring-shaped and surrounds the active area. A layer of gate insulation material is formed. A layer of polysilicon is formed, and portions thereof are patterned and etched away to form plural spaced openings in the active area and at least another opening which exposes the ring-shaped opening in the layer of field insulation material. A remaining portion of the polysilicon layer that is atop the field insulation material defines a polysilicon field plate. Impurities of a first conductivity type are introduced into first surface regions of the silicon substrate that are located beneath the plural openings in the layer of polysilicon and into second surface regions located beneath the ring-shaped opening in the field insulation material to form first diffused regions. Impurities of a second conductivity type are introduced into the first and second surface regions to form second diffused regions. An overlaying insulation material is deposited and selected portions are patterned and etched away to form first openings that expose portions of the first and second surface regions and second openings which expose portions of the polysilicon field plate. Depressions are etched in portions of the first and second surface regions to a depth that is greater than that of the second diffused regions, and sidewalls of the overlaying insulation layer are etched to expose further portions of the first and second surface regions which each are adjacent to and surround respective ones of the depressions. An overlaying conductive layer is deposited, and portions thereof are patterned and etched away to form at least one source contact which connects the depressions and the further portions of the first surface regions and to form at least one further electrode which connects the polysilicon field plate with the depressions and the further portions of the second surface regions.

In accordance with this aspect of the invention, impurities of the first conductivity type are introduced into the first and second surface regions to form third diffused regions. The second diffused regions have a final depth that is less than that of the third diffused regions, and the first diffused regions are deeper and wider than and have a lower concentration than that of the third diffused regions. The further electrode thus connects the polysilicon field plate with the second and third diffused regions of the second surface regions.

Other features and advantages of the present invention will become apparent from the following description of the invention which refers to the accompanying drawings.

BRIEF DESCRIPTION OF THE DRAWINGS

The invention will now be described in greater detail in the following detailed description with reference to the drawings in which:

FIG. 1 shows a top view of a known MOS-gated device.

FIG. 2 shows the cell topology of the surface of the known MOS-gated device.

FIG. 3 shows a cross-sectional view of the MOS-gated device of FIG. 2 taken across section line 2—2.

DETAILED DESCRIPTION OF THE INVENTION

Figure 4:
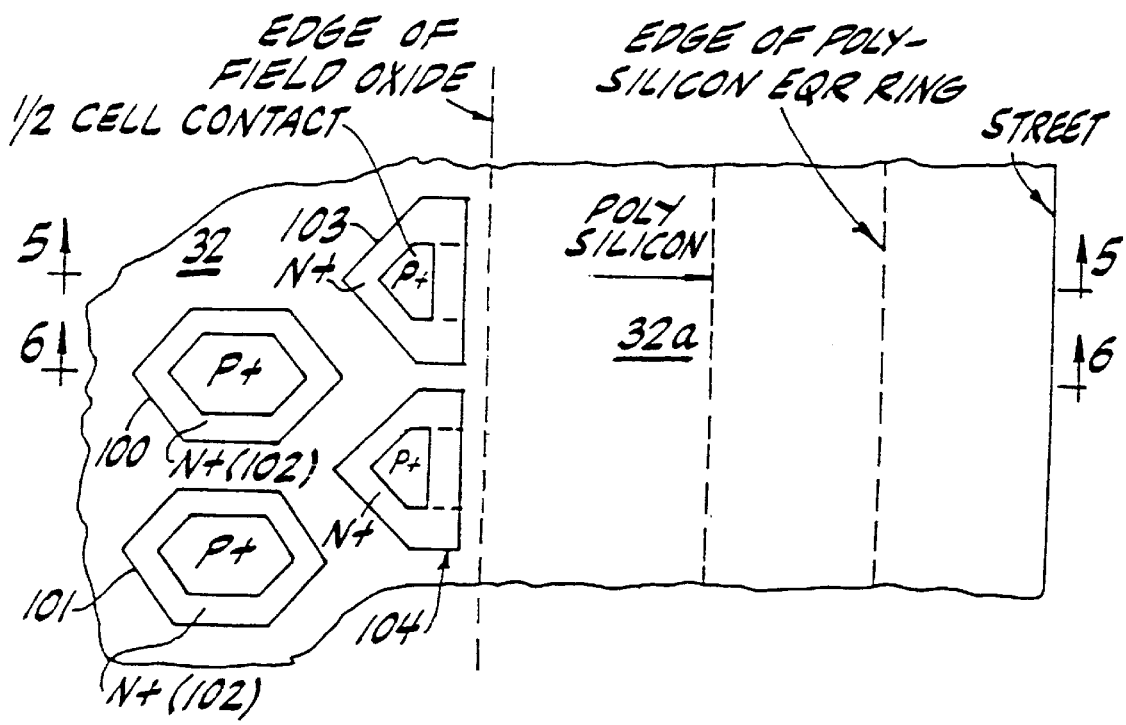
FIG. 4 shows the cell topology of a portion of the outermost active cells and the termination region of the MOS-gated device of FIG. 1.

The present invention is directed to a guard ring structure and its fabrication process that can be used to terminate any type of semiconductor device. However, it is particularly applicable for use with a device and process such as that described in U.S. Pat. No. 5,795,793 as well as that described in U.S. Pat. No. 5,940,721, which is also incorporated herein by reference.

FIG. 1 shows a top view of a known MOSFET die 20, into which the guard ring structure of the invention may be incorporated. The MOSFET die 20 may be a power MOSFET HEX 2.5 die as is sold by the International Rectifier Corporation of El Segundo, Calif. Typically, the die 20 has a dimension of 110×140 mils and has a source contact surface 21, a gate pad 22 and has gate busses 24, 25 and 26 extending therefrom. A drain contact (not shown) is located on the bottom of die 20.

The device, however, can have any desired junction pattern that defines a desired MOS-gate controlled device. FIG. 2 and FIG. 3, which is a cross-section of FIG. 2 taken across section line 2—2, show a typical junction pattern which may be used as in the circled area of FIG. 1 labelled "FIGS. 2 and 3", namely that of aforementioned U.S. Pat. No. 5,795,793. FIGS. 2 and 3 show a few of the parallel connected spaced hexagonal cellular MOSFET elements which are formed within an $N^-$ epitaxially formed region 30 and which include identical spaced $P^-$ base or channel diffusion regions 40 and 41 each of which contains an $N^+$ source regions 51 and a $P^+$ region 50 that is situated below the $N^+$ source regions. The invertible $P^-$ channel 52 is arranged beneath a gate oxide layer 31 and a polysilicon gate layer 32 shown in FIG. 3.

A low temperature oxide layer (LTO) 80, 82, 83 (LTO) overlies and insulates the segments of the gate polysilicon 32 to prevent the polysilicon 32 from connecting to the $N^+$ sources via the source metal (aluminum) 84.

While the cells can have any desired dimensions, the cells shown in FIG. 3 typically have a width of about 5.8 microns and a typical separation of about 5.8 microns. The contact opening has a short dimension of, typically, about 2 microns. Each cell may be elongated, as shown, to a non-critical horizontal dimension.

While the above device is shown for an N-channel device, it will be apparent to those skilled in the art that the opposite conductivity types can be substituted for each region to make the device a P-channel device. The complete devices can also be mounted in a surface mount package or a non-surface mount package such as a T0220 package.

FIGS. 4–7 show a known termination structure that is suitable for either N or P channel devices and which can be manufactured using the same process steps that is used to make the cells shown in FIGS. 2 and 3.

Figure 5:
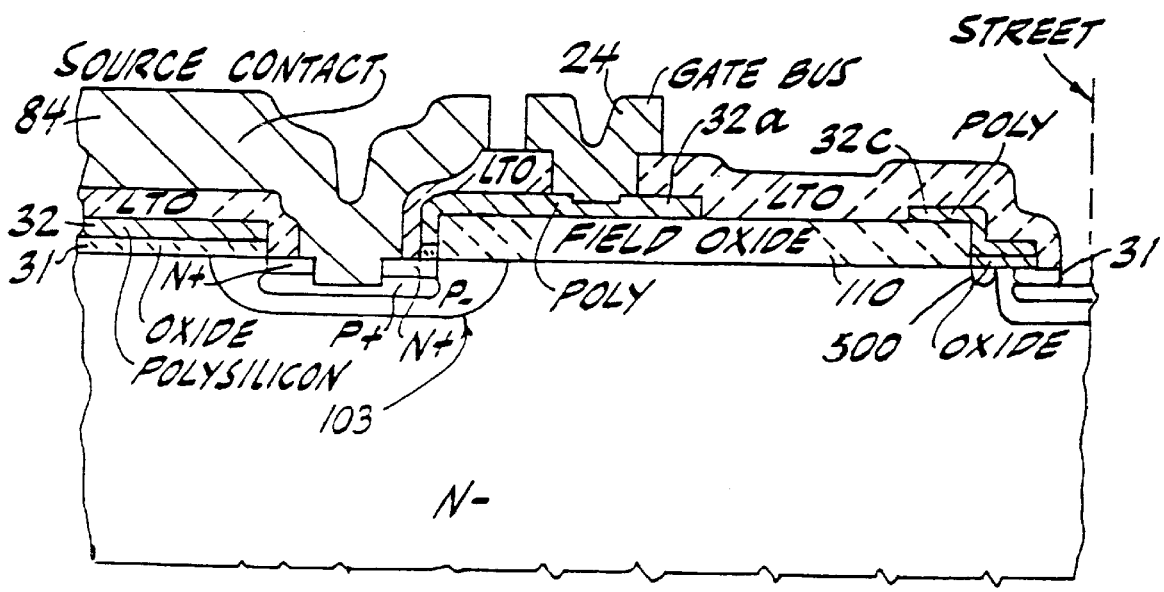
FIG. 5 shows a cross-sectional view of the MOS-gated device of FIG. 4 taken across section line 5—5.
Figure 6:
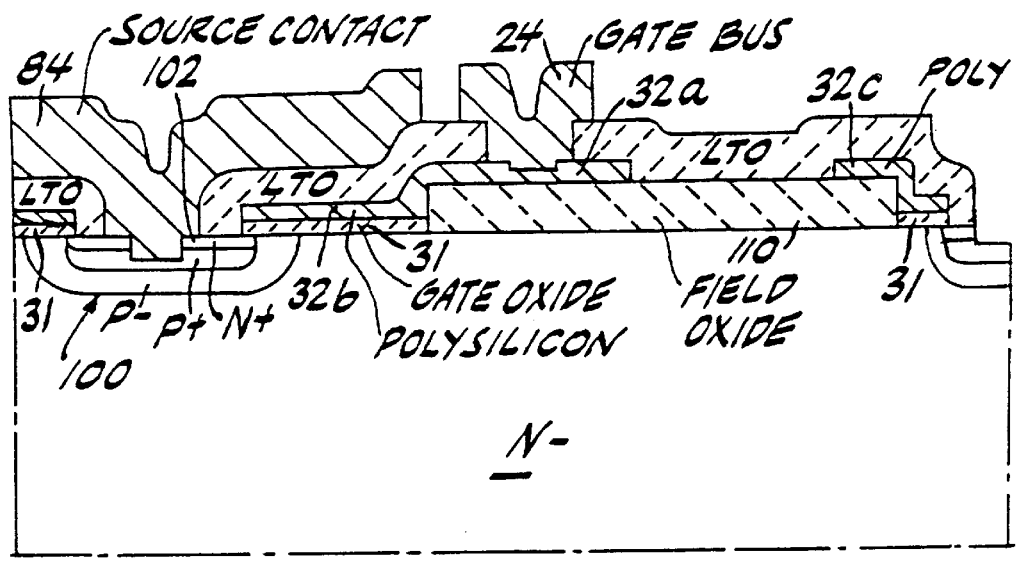
FIG. 6 shows a cross-sectional view of the MOS-gated device of FIG. 4 taken across section line 6—6.

The circled area of FIG. 1, labeled "FIGS 4, 5 and 6" comprises the termination structure of gate bus 24 of FIG. 1. The circled area of FIG. 1 labeled "FIG. 7" comprises the termination structure of gate bus 25 and 26.

Referring first to FIG. 4, two of the last or outermost complete active area cells 100 and 101 are shown. FIG. 4 shows these cells with the top of the polysilicon layer 32 exposed so that the $N^+$ source 102 and $P^+$ layers of the cells are shown. The active area cells 100 and 101 are shown in FIG. 6 in a cross section view of FIG. 4 taken along line 6–6. FIG. 6, however, also shows the overlaying low temperature oxide layer as well as source contact 84 and gate bus 24.

The active cells 100 and 101 are adjacent to terminating half cells 103 and 104, shown in FIGS. 4 and 5, which are formed during the same process steps which form cells 100 and 101. FIG. 5 is a cross-section view of FIG. 4 taken along line 5—5.

The field oxide layer 110 serves as an insulation layer between the gate bus and the silicon substrate. The edge of the active area polysilicon serves as a diffusion window to define the $P^-$, $N^+$ and $P^+$ portions of the terminating half cells 103 and 104 which, in part, underlie the field oxide 110. The top surface of field oxide 110 is also partially covered with a polysilicon strip 32a which is deposited and patterned in the same process steps as the active area main polysilicon gate 32.

As shown in FIG. 6, narrow fingers 32b of the polysilicon layer extend from the main web 32 of the polysilicon layer and connect to the strip 32a. The width of the fingers should be minimized to allow the $P^-$ regions to diffuse together under fingers 32b and form an uninterrupted region at the edge of the chip (2 μm in width for example). Wider separations result in lower avalanche voltage. The strip 32a is, in turn, connected to the gate bus 24 which is simply an isolated strip of the same metal layer that is deposited to form the source contact 84.

The LTO layer shown in FIGS. 5 and 6 is deposited at the same time as the LTO layer 80, 82, 83 in FIG. 3. An equipotential ring of polysilicon (EQR ring) 32c is also formed during the formation of the active area polysilicon 32 but overlies the edge of the field oxide 110 as shown. The EQR ring also contacts the gate oxide layer located atop the region adjacent to the street but does not contact the enhancement implant 500 at the termination side of the EQR ring to prevent formation of an inversion channel which can cause leakage current. It is connected to the street region which is typically at the drain potential.

Figure 7:
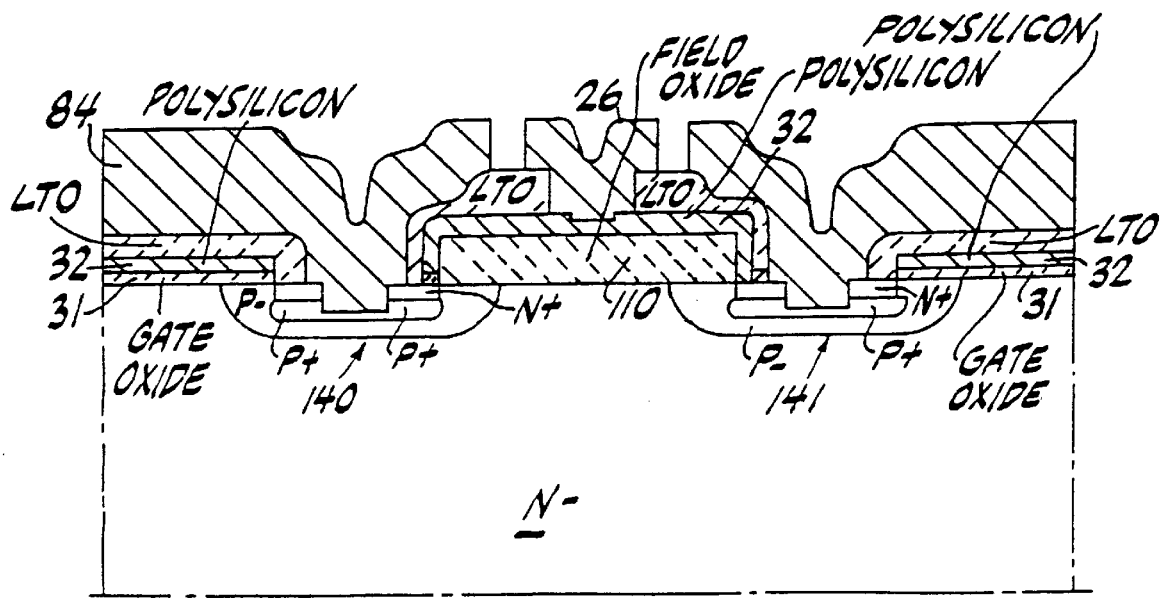
FIG. 7 shows a cross-sectional view of a region of the MOS-gated device of FIG. 1 which includes a center gate bus.

FIG. 7 shows the manner in which the termination structure of FIGS. 4, 5 and 6 can be applied to the terminating half cells that are adjacent to the gate bus 25 or 26 located at the interior of the die. Thus, terminating half cells 140 and 141, which are similar to cells 103 and 104 shown in FIGS. 4 and 5, are terminated by a structure similar to the left-hand symmetric side, relative to bus 24, in FIGS. 5 and 6.

The process that forms the junction pattern shown in FIGS. 2 and 3 and the termination structure shown in FIGS. 4–7 are likewise described in the aforementioned U.S. Pat. Nos. 5,795,793 and 5,940,721. It should be noted that the N-body 30 shown in FIGS. 3 and 5–7 may be an epitaxial layer grown atop an $N^+$ substrate (not shown).

A field oxide layer 110, shown in FIGS. 5 and 6, is formed atop the N-type body. A photoresist layer is deposited atop the field oxide and then patterned using a first photolithographic mask step to form openings to the field oxide layer. The exposed portions of the field oxide are then etched away to expose the active device areas. Preferably, an isotropic wet etch is employed to cause the edges of the field oxide to have a tapered profile. However, an anisotropic etch process may also be used.

A gate insulation layer 31 is then formed atop the N-body 30 and may be a thermally grown silicon dioxide layer. Typically the gate insulation layer has a thickness of about 450 angstroms for a 30 volt rated device and a thickness of about 750 angstroms for a 55 volt or higher (such as 250 V) rated device. The gate oxide layer 31 is then covered, in turn, by a layer of polysilicon 32.

A photoresist layer is then deposited atop the polysilicon layer and patterned using another photolithographic mask step. Openings are formed through the photoresist to the surface of the polysilicon layer 32. Following the formation of openings in the photoresist layer, an anisotropic etch is employed to etch the exposed portions of polysilicon. The etch is selective enough to remove the exposed polysilicon portions but stops prior to completely removing oxide anywhere on the wafer. Thereafter, the underlying exposed silicon dioxide may be removed, if desired, with an isotropic wet etch. However, it is also possible to leave the gate oxide mostly intact at this step in the process and subsequently implant dopants with sufficiently high energy to penetrate the gate oxide.

The photoresist is stripped, and, thereafter, an implant is carried out through the windows in the polysilicon and employing boron as the implant species. Following this implant operation, the P-type implants are driven in to form the P type regions 40 and 41. Then, a relatively high $N^+$ dose of arsenic or phosphorus is implanted through the polysilicon windows, and, subsequently, a $P^+$ dose of boron is implanted through the windows.

Thereafter, the $N^+$ and $P^+$ implants are driven in to form regions 50 and 51. A layer of low temperature oxide ("LTO") 80, 82, 83 is then deposited atop the surface of the wafer. The $N^+$ layer 51 will be shallower than the $P^+$ layer 50 by an amount selected by the designer and determined by the species and doses used.

Another photoresist layer is then applied atop the LTO layer 80, 82, 83 and is patterned by a third mask step to form well-aligned small central openings located at the axis of each of the individual cells. The LTO layer 80, 82, 83 is then etched by an anisotropic oxide etch to open a central openings to the silicon surface.

Thereafter, another anisotropic etch etches the exposed silicon surface so that holes are formed in the silicon surface which penetrate the $N^+$ layers 51 and reach the $P^+$ layer 50 for each cell. The wafer is then exposed to an isotropic wet etch which laterally etches the LTO layer 80, 82, 83.

Then, the photoresist is stripped, and a contact metal layer, such as aluminum, is deposited over the full surface of the device to fill in the openings in the LTO layer and the openings in the silicon substrate and to overlay the exposed silicon shoulders formed by the lateral etches in the LTO layer. A further photoresist layer is then applied atop the contact metal layer and is patterned by a fourth mask step, and the contact metal layer is then etched by an isotropic oxide etch to define the source contact 84, which connects the $N^+$ source regions to their respective underlying $P^+$ regions, as well as to define the gate bus 24.

A drain (or anode) contact (not shown) may be connected to the $N^+$ substrate and may be available for connection at either surface of the chip. If the device is to be made into an IGBT, a thin $N^+$ buffer layer and $P^+$ bottom layer are included at the bottom of the wafer structure in the conventional manner.

Figure 8:
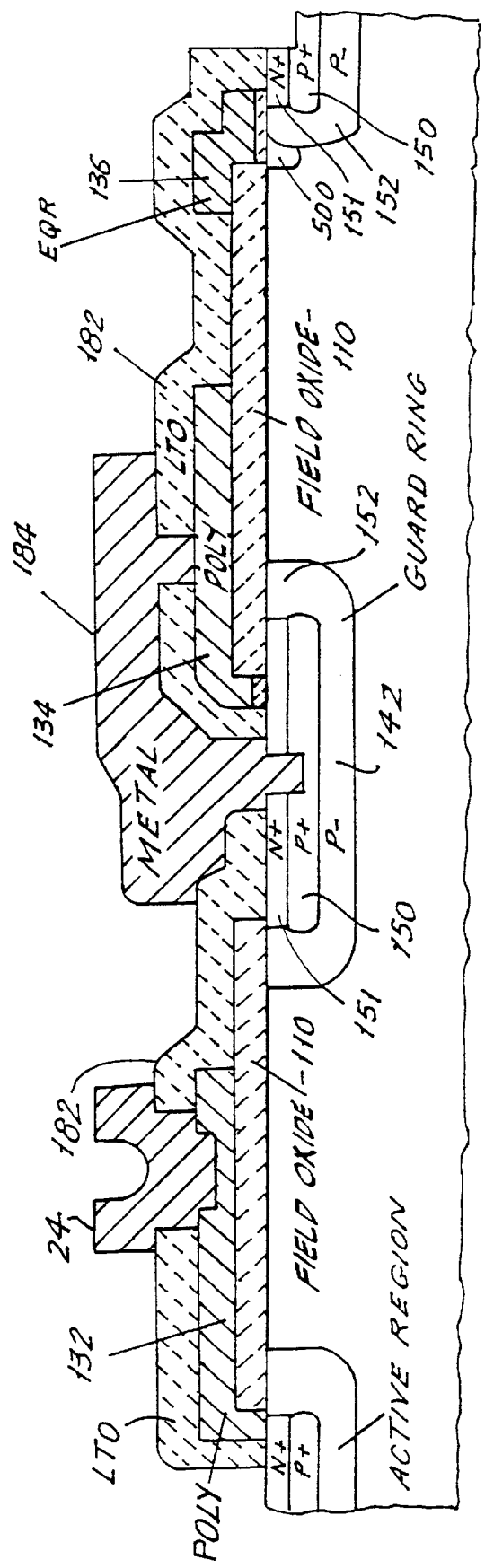
FIG. 8 shows a cross-sectional view of the guard ring region of an MOS-gated device according to an embodiment of the invention.

According to the invention, an electrically floating guard ring structure shown in FIG. 8 is included in the termination region of the device in addition to, or in place of, the termination structure shown in FIGS. 4–7.

The guard ring surrounds the active area of the device and is formed in an opening in the field oxide layer 110. The guard ring is formed of the same diffusions that formed the $P^-$ base, $N^+$ source and $P^+$ diffusions of the active area shown in FIGS. 2 and 3 to form $N^+$ region 151, $P^+$ region 150 and $P^-$ region 142. The $P^-$ region 142 forms the guard ring, and the $P^+$ and $N^+$ regions provide contacts thereto. Additionally, an isolated segment of the same polysilicon layer that forms the insulated gate 132 also forms a field plate 134 atop the field oxide and is adjacent to, or may overlap a portion of, the guard ring. An aluminum contact 184 connects the polysilicon field plate with the $N^+$ and the $P^+$ diffusions of the guard ring through openings formed in LTO layer 182. A trench may also be formed in the silicon substrate of the guard ring to provide an opening to the $P^+$ contact region.

Advantageously, the same process steps that form the active device shown in FIGS. 2 and 3 are used to form the guard ring without requiring any further masking steps.

A further advantage of the invention is that the guard ring structure extends the voltage rating of the device from the 30 or 55 volt ratings of the device of FIGS. 2 and 3 to a 250 volt rated device without increasing the gate oxide thickness and without depositing and defining a passivation layer.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for fabricating a termination structure of a semiconductor device which includes a guard ring, said process comprising the steps of:

forming a layer of field insulation material atop a silicon substrate;

patterning and etching away selected portions of said layer of field insulation material to form at least one opening therein which defines an active area and at least another opening which is substantially ring-shaped and surrounds said active area for forming the guard ring;

depositing a layer of polysilicon;

patterning and etching away selected portions of said layer of polysilicon to form at least an opening which exposes said ring shaped opening in said layer of field insulation material, a remaining portion of said layer of polysilicon that is atop said layer of field insulation material defining a polysilicon field plate;

introducing impurities of a first conductivity type into surface regions of said silicon substrate located beneath said ring shaped opening in said layer of field insulation material to form first diffused regions;

introducing impurities of a second conductivity type into said surface regions of said silicon substrate located beneath said ring shaped opening to form second diffused regions, said first diffused regions being deeper and wider than said second diffused regions;

depositing an overlaying insulation layer;

patterning and etching away selected portions of said overlaying insulation layer to form first openings therein which expose portions of said polysilicon field plate and second openings which expose portions of said surface regions of said silicon substrate;

etching depressions in said portions of said surface regions of said silicon substrate to a depth greater than the depth of said second diffused regions;

depositing an overlaying conductive layer; and patterning and etching away portions of said conductive layer to form at least one electrode which connects said polysilicon field plate with said surface regions of said silicon substrate.

2. The method of claim 1 further comprising the step of: etching side walls of said overlaying insulation layer to expose further portions of said surface regions of said silicon substrate each of which is adjacent to and surrounds a respective one of said depressions; wherein said at least one electrode connects said polysilicon field plate with said depressions and said further portions of said surface regions of said silicon substrate.

3. The method of claim 1 further comprising the step of: introducing impurities of said first conductivity type into said surface regions of said silicon substrate to form third diffused regions; said second diffused regions having a final depth that is less than that of said third diffused regions, said first diffused regions being deeper and wider than and having a lower concentration than that of said third diffused regions; said at least one electrode connecting said polysilicon field plate with said second and third diffused regions of said surface regions of said silicon substrate.

4. The method of claim 1 wherein said first conductivity type is P-type and said second conductivity type is N-type.

5. The method of claim 1 wherein said first conductivity type is N-type and said second conductivity type is P-type.

6. The method of claim 1 wherein said steps of introducing impurities of said first and second conductivity type includes implanting each of said impurities into said silicon substrate and then driving in said impurities.

7. A process for fabricating a semiconductor device having a termination structure which includes a guard ring, said process comprising the steps of:

forming a layer of field insulation material atop a silicon substrate;

patterning and etching away selected portions of said layer of field insulation material to form at least one opening therein which defines an active area and at least another opening which is substantially ring-shaped and surrounds said active area;

forming a layer of gate insulation material;

depositing a layer of polysilicon;

patterning and etching away selected portions of said layer of polysilicon to form a plurality of spaced openings in said active area and at least another opening which exposes said ring shaped opening in said layer of field insulation material, a remaining portion of said layer of polysilicon that is atop said layer of field insulation material defining a polysilicon field plate;

introducing impurities of a first conductivity type into first surface regions of said silicon substrate located beneath said plural openings in said layer of polysilicon and into second surface regions of said silicon substrate located beneath said ring shaped opening in said layer of field insulation material to form first diffused regions;

introducing impurities of a second conductivity type into said first and second surface regions of said silicon substrate to form second diffused regions;

depositing an overlaying insulation layer;

patterning and etching away selected portions of said overlaying insulation layer to form first openings therein which expose portions of said first and second surface regions of said silicon substrate and second openings which expose portions of said polysilicon field plate;

etching depressions in said portions of said first and second surface regions of said silicon substrate to a depth greater than the depth of said second diffused regions;

etching side walls of said overlaying insulation layer to expose further portions of said first and second surface regions of said silicon substrate each of which is adjacent to and surrounds a respective one of said depressions;

depositing an overlaying conductive layer; and patterning and etching away portions of said conductive layer to form at least one source contact which connects said depressions and said further portions of said first surface regions of said silicon substrate and at least one further electrode which connects said polysilicon field plate with said depressions and said further portions of said second surface regions of said silicon substrate.

8. The method of claim 7 further comprising the step of: introducing impurities of said first conductivity type into said first and second surface regions of said silicon substrate to form third diffused regions; said second diffused regions having a final depth that is less than that of said third diffused regions, said first diffused regions being deeper and wider than and having a lower concentration than that of said third diffused regions; said further electrode connecting said polysilicon field plate with said second and third diffused regions of said second surface regions of said silicon substrate.

9. The method of claim 7 wherein step of patterning and etching away portions of said conductive layer further forms at least one gate contact.

10. The method of claim 7 wherein said first conductivity type is P-type and said second conductivity type is N-type.

11. The method of claim 7 wherein said first conductivity type is N-type and said second conductivity type is P-type.

12. The method of claim 7 wherein said steps of introducing impurities of said first and second conductivity type includes implanting each of said impurities into said silicon substrate and then driving in said impurities.

* * * * *